US010911070B2

(12) United States Patent
Sunwoo et al.

(10) Patent No.: US 10,911,070 B2
(45) Date of Patent: Feb. 2, 2021

(54) METHOD AND APPARATUS FOR DECODING POLAR CODES BASED ON SHARED NODE

(71) Applicant: AJOU UNIVERSITY INDUSTRY-ACADEMIC COOPERATION FOUNDATION, Suwon-si (KR)

(72) Inventors: Myung Hoon Sunwoo, Seoul (KR); Seo Rin Jung, Seoul (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 0 days.

(21) Appl. No.: 16/528,967

(22) Filed: Aug. 1, 2019

(65) Prior Publication Data
US 2020/0266840 A1    Aug. 20, 2020

(30) Foreign Application Priority Data
Feb. 14, 2019    (KR) .......................... 10-2019-0017454

(51) Int. Cl.
    *H03M 13/37*    (2006.01)
    *H03M 13/13*    (2006.01)
(52) U.S. Cl.
    CPC ....... *H03M 13/3746* (2013.01); *H03M 13/13* (2013.01)

(58) Field of Classification Search
    CPC .................................. H03M 13/3746
    USPC .................. 714/752, 755, 749, 754
    See application file for complete search history.

(56) References Cited

U.S. PATENT DOCUMENTS

| 10,305,514 | B2 * | 5/2019 | Giard ..................... H03M 13/13 |
| 2015/0227403 | A1 * | 8/2015 | Zhang ................. H03M 13/373 714/704 |
| 2015/0263767 | A1 * | 9/2015 | Shin ....................... H03M 13/13 714/796 |
| 2016/0013814 | A1 * | 1/2016 | Cideciyan ......... H03M 13/2927 714/755 |
| 2016/0056843 | A1 * | 2/2016 | Gross ................ H03M 13/6561 714/781 |

FOREIGN PATENT DOCUMENTS

KR    10-1617965 B1    5/2016

* cited by examiner

*Primary Examiner* — Fritz Alphonse
(74) *Attorney, Agent, or Firm* — Sughrue Mion, PLLC

(57) ABSTRACT

The present disclosure a method of decoding a polar code based on a shared node, the method includes extracting an input node from target data that are data to be decoded, by an extractor, sorting the input node as one of a first node of which the pattern of the frozen bit satisfies a predetermined first reference, a second node of which the pattern of the information bit satisfies a predetermined second reference, and a third node that is not the first node and the second node, by a sorter, calculating at least one codeword candidate and at least one path metric that correspond to the input node in accordance with the sorting result by a calculator, finishing decoding the target data by iterating the extracting, the sorting as one, and the calculating of at least one path metric by a controller.

10 Claims, 3 Drawing Sheets

[FIG. 1]

[FIG. 1]
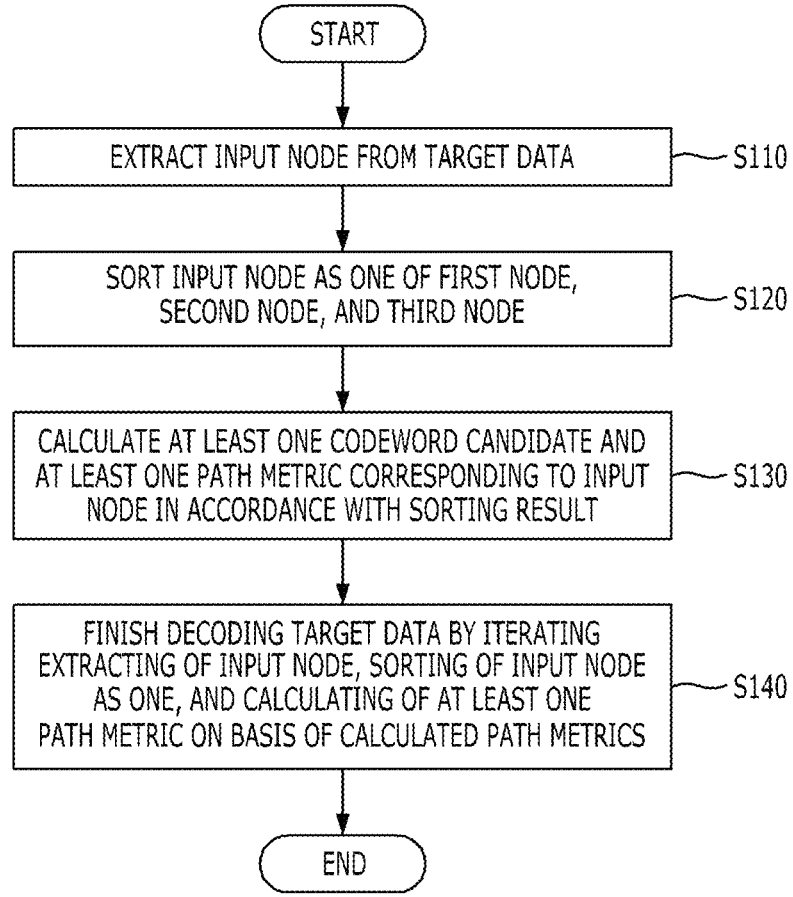
[FIG. 2]
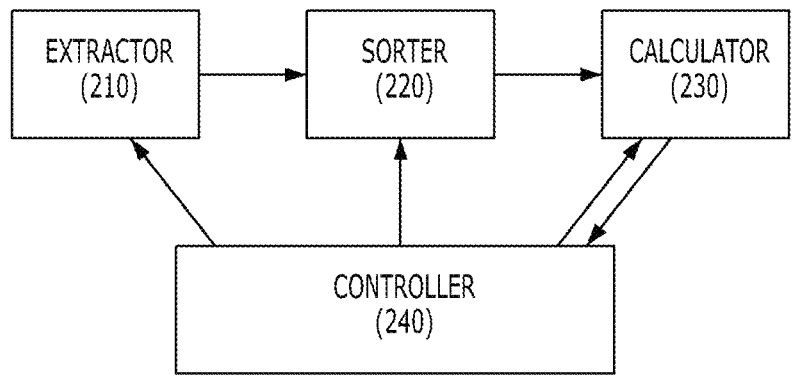

[FIG. 3]
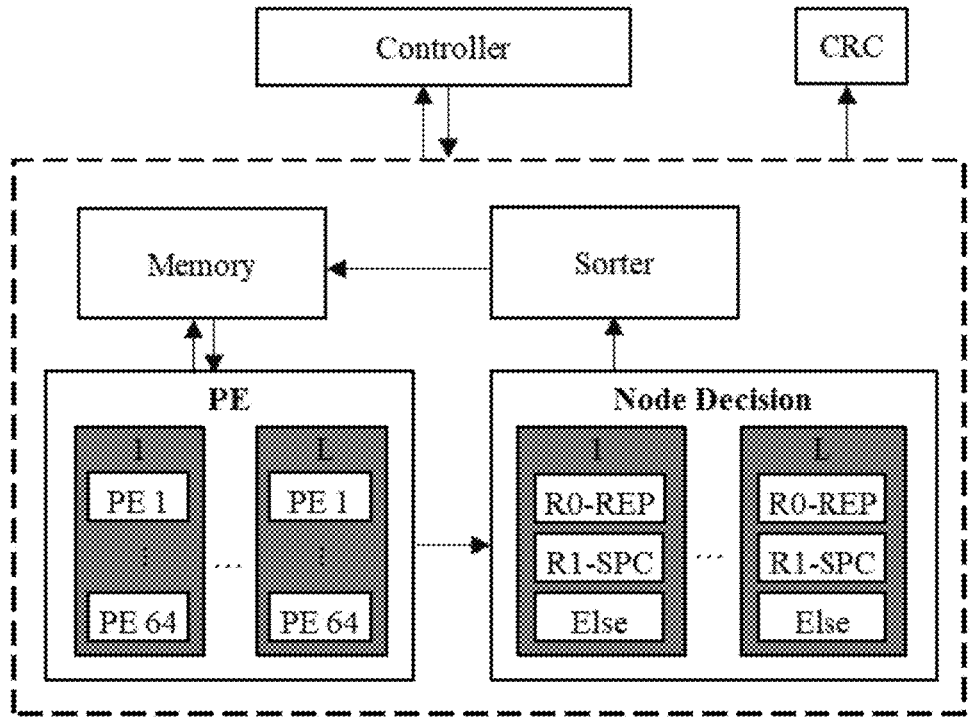
[FIG. 4]
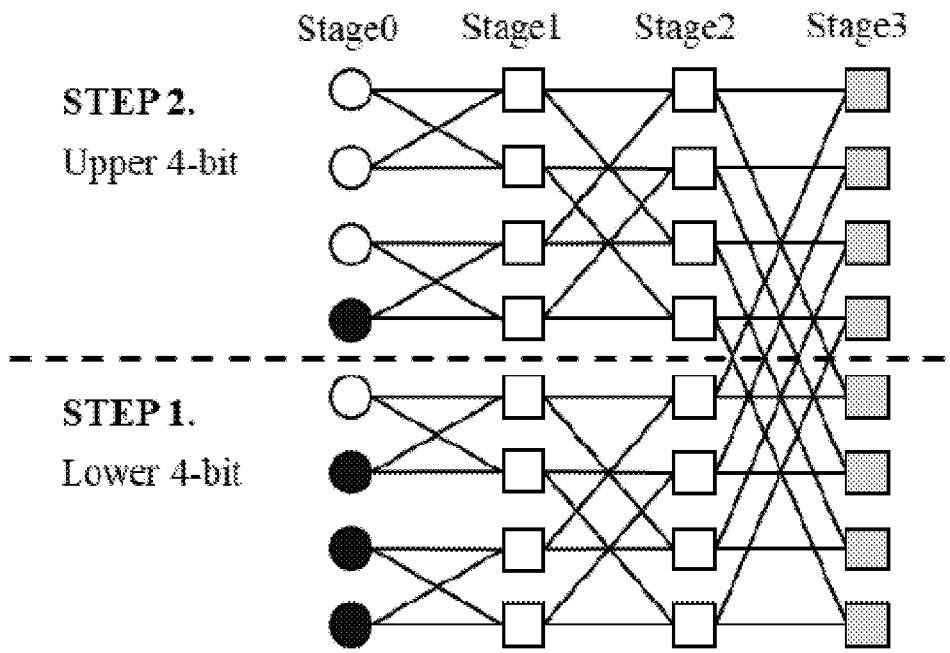

[FIG. 5]
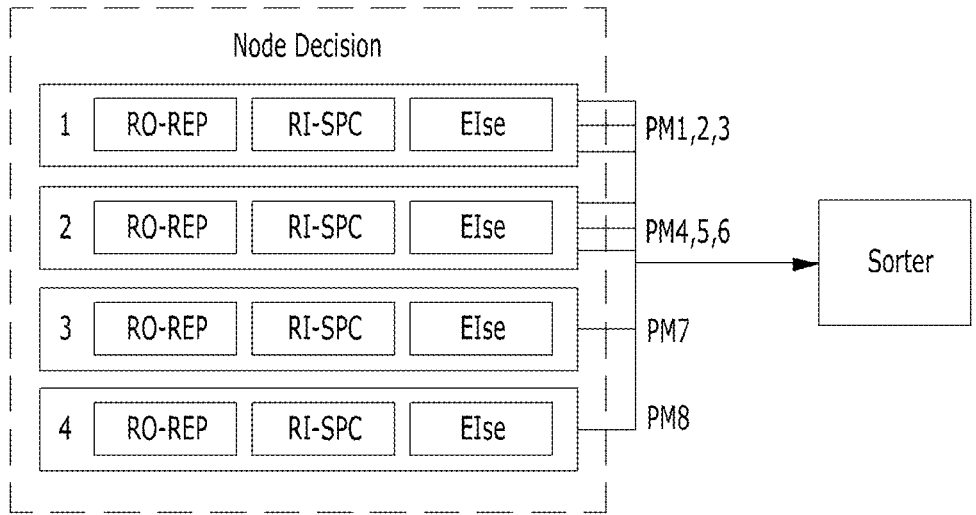
[FIG. 6]
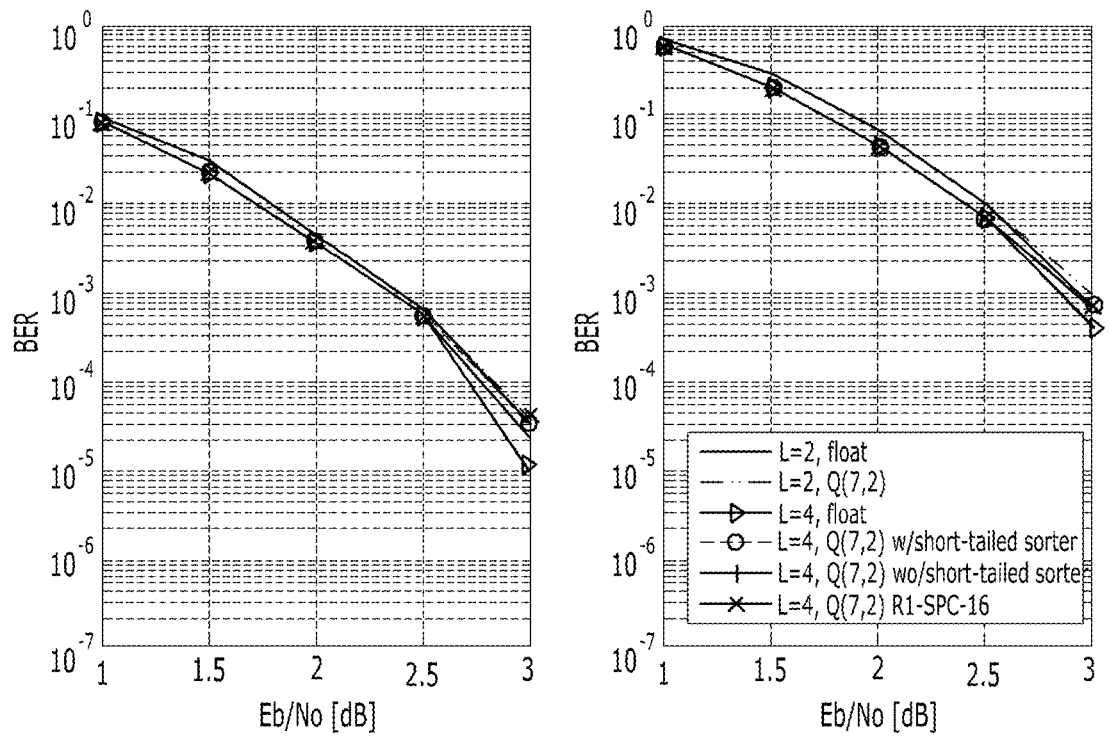

METHOD AND APPARATUS FOR DECODING POLAR CODES BASED ON SHARED NODE

CROSS-REFERENCE TO RELATED APPLICATIONS

This application claims the priority of Korean Patent Application No. 10-2019-0017454 filed on Feb. 14, 2019, in the Korean Intellectual Property Office, the disclosure of which is incorporated herein by reference.

BACKGROUND

Field

The present disclosure a method and apparatus for decoding polar codes, the method and apparatus performing decoding using shared nodes on nodes having the same sorting result according to a bit pattern.

Description of the Related Art

A polar code has been actively studied up to now since 2009 and the value was recognized, to it has been decided to apply to a control unit of 5G standard communication. A polar code shows performance as much as that of LDPC (low-density parity check) that is a current high-performance code and has the advantage of low encoding/decoding complexity, so it has high possibility of being applied to various fields in the future. Further, a polar code can be applied to various fields of wireless communication such as Wi-Fi, Bluetooth, and Zigbee, in addition to 5G, storage media (SSD and flash devices), image processing (DVD, HDTV), and a biosystem.

5G takes aim at very high speed, very low delay, and very high reliability. 5G has a 20-time speed and a delay speed of $\frac{1}{10}$ in comparison to 4G. Further, 5G supports connections of one million/km$^2$ that is ten times much than 4G for connecting devices such as IoT. For the future technology such as self-driving or telemedicine, a high speed and a high response speed are necessary and the reliability of data becomes very important, so the function of correction codes also becomes important. Further, a small area is required for small devices such as IoT.

Further, existing successive-cancellation (SC) and SC-List (SCL) algorithms for decoding polar codes have a problem that the delay time is long due to sequential calculation. In order to solve this problem, an algorithm that can quickly determine bits by dividing polar codes into small node units has been proposed, but it determines one bit at a time, so there is still a problem that decoding takes a long time.

As another algorithm, an algorithm that reduces decoding steps by determining several bits at a time has been proposed, but there is a defect that the throughput is low because a time delay occurs when a candidate path metric (PM) is selected.

Accordingly, it is required to increase the data processing amount of polar codes and implement a small area in order to solve these requirements and problems in the existing technologies.

DOCUMENTS OF RELATED ART (Patent Document 1) Korean Patent No. 10-1617965 (2016.4.27.)

SUMMARY

The present disclosure relates to an efficient method of determining several bits at a time to reduce a long delay time when decoding polar codes, and in detail, an object of the present disclosure is to provide a method and apparatus for decoding, the method and apparatus using one node combining two kinds of nodes and a node for other bits to determine multiple bits.

Further, another object of the present disclosure is to provide a method and apparatus for decoding, the method and apparatus using an efficient path creating method to solve a problem that delay time for arranging paths later increases when many paths are created to determine multiple bits.

The object(s) of the present disclosure is not limited to those described above and (an)other objects may be made apparent to those skilled in the art from the following description.

A method of decoding a polar code based on a shared node according to an embodiment of the present disclosure for achieving the objects includes: extracting an input node from target data that are data to be decoded, by an extractor; sorting the input node as one of a first node of which the pattern of the frozen bit satisfies a predetermined first reference, a second node of which the pattern of the information bit satisfies a predetermined second reference, and a third node that is not the first node and the second node, by a sorter; calculating at least one codeword candidate and at least one path metric that correspond to the input node in accordance with the sorting result by a calculator; and finishing decoding the target data by iterating the extracting of an input node, the sorting of the input node as one, and the calculating of at least one path metric on the basis of the calculated path metric by a controller.

Preferably, the calculating of at least one path metric may calculate predetermined numbers of codeword candidates and path metrics in accordance with the ascending order of the path metrics.

Preferably, the finishing of decoding the target data may iterate the calculating of at least one path metric to calculate differently determined numbers of codeword candidates and path metrics in accordance with the ascending order of the calculated path metrics.

Preferably, the sorting of the input node as one may sort the input node as the first node when the input node is a Rate-0 node composed of only a frozen bit or a repetition (REP) node composed of a plurality of frozen bits and one information bit, and may sort the input node as the second node when the input node is a Rate-1 node composed of only an information bit or a single parity check (SPC) node composed of a plurality of information bits and one frozen bit.

Preferably, the calculating of at least one path metric may include: when the input node is sorted as the third node, calculating a primary codeword candidate and a path metric that correspond to the third node on the basis of low-order bits of the third node; and determining a codeword candidate corresponding to the third node using high-order bits of the third node and the primary codeword candidate.

Further, an apparatus for decoding a polar code based on a shared node according to an embodiment of the present disclosure for achieving the objects includes: an extractor that extracts an input node from target data that are data to be decoded; a sorter that sorts the input node as one of a first node of which the pattern of the frozen bit satisfies a predetermined first reference, a second node of which the pattern of the information bit satisfies a predetermined second reference, and a third node that is not the first node and the second node; a calculator that calculates at least one codeword candidate and at least one path metric that correspond to the input node in accordance with the sorting result; and a controller that finishes decoding the target data by repeatedly controlling the extractor, the sorter, and the calculator on the basis of the calculated path metrics.

Preferably, the calculator may calculate predetermined numbers of codeword candidates and path metrics in accordance with the ascending order of the path metrics.

Preferably, the controller may control the calculator to calculate differently determined numbers of codeword candidates and path metrics in accordance with the ascending order of the calculated path metrics.

Preferably, the sorter may sort the input node as the first node when the input node is a Rate-0 node composed of only a frozen bit or an REP node composed of a plurality of frozen bits and one information bit, and may sort the input node as the second node when the input node is a Rate-1 node composed of only an information bit or an SPC node composed of a plurality of information bits and one frozen bit.

Preferably, when the input node is sorted as the third node, the calculator may calculate a primary codeword candidate and a path metric that correspond to the third node on the basis of low-order bits of the third node, and may determine a codeword candidate corresponding to the third node using high-order bits of the third node and the primary codeword candidate.

The present disclosure relates to an efficient method of determining several bits at a time to reduce a long delay time when decoding a polar code. In detail, since the method uses one node grouping two kinds of nodes, and nodes for other bits to determine multiple bits, there are effects that a short clock cycle is consumed, high throughput is shown, and an area can be reduced using a shared node, so there is an effect of excellent throughput to an area.

Further, the present disclosure has an effect of solving the problem when many paths are created when determining multiple bits, so delay time for aligning the paths later increases, by applying an efficient path creating method.

BRIEF DESCRIPTION OF THE DRAWINGS

The above and other aspects, features and other advantages of the present disclosure will be more clearly understood from the following detailed description taken in conjunction with the accompanying drawings, in which:

FIG. 1 is a flowchart illustrating a method of decoding polar codes based on a shared node according to an embodiment of the present disclosure;

FIG. 2 is a block diagram illustrating an apparatus for decoding polar codes based on a shared node according to an embodiment of the present disclosure;

FIG. 3 is a diagram illustrating a hardware architecture of an apparatus for decoding polar codes according to an SCL algorithm;

FIG. 4 is a diagram illustrating a process of an 8-bit third node according to an embodiment of the present disclosure;

FIG. 5 is a diagram illustrating an operation method of short tailed sorter according to an embodiment of the present disclosure; and FIG. 6 is a diagram illustrating BER performance and FER performance of a method of decoding polar codes according to an embodiment of the present disclosure.

DETAILED DESCRIPTION OF THE PREFERRED EMBODIMENT

The present disclosure may be modified in various ways and implemented by various exemplary embodiments, so that specific exemplary embodiments are shown in the drawings and will be described in detail herein. However, it is to be understood that the present disclosure is not limited to the specific exemplary embodiments, but includes all modifications, equivalents, and substitutions included in the spirit and the scope of the present disclosure. Similar reference numerals are assigned to similar components in the following description of drawings.

Terms used in the specification, 'first', 'second', 'A', 'B', etc., may be used to describe various components, but the components are not to be construed as being limited to the terms. The terms are used only to distinguish one component from another component. For example, the 'first' component may be named the 'second' component, and vice versa, without departing from the scope of the present disclosure. The term 'and/or' includes a combination of a plurality of relevant items or any one of a plurality of relevant terms.

It is to be understood that when one element is referred to as being "connected to" or "coupled to" another element, it may be connected directly to or coupled directly to another element or be connected to or coupled to another element, having the other element intervening therebetween. On the other hand, it is to be understood that when one element is referred to as being "connected directly to" or "coupled directly to" another element, it may be connected to or coupled to another element without the other element intervening therebetween.

Terms used in the present specification are used only in order to describe specific exemplary embodiments rather than limiting the present disclosure. Singular forms are intended to include plural forms unless the context clearly indicates otherwise. It will be further understood that the terms "comprises" or "have" used in this specification, specify the presence of stated features, numerals, steps, operations, components, parts, or a combination thereof, but do not preclude the presence or addition of one or more other features, numerals, steps, operations, components, parts, or a combination thereof.

Unless defined otherwise, it is to be understood that all the terms used in the specification including technical and scientific terms have the same meaning as those that are understood by those who skilled in the art. It will be further understood that terms used herein should be interpreted as having a meaning that is consistent with their meaning in the context of this specification and the relevant art and will not be interpreted in an idealized or overly formal sense unless expressly so defined herein.

Hereinafter, preferred embodiments of the present disclosure will be described in detail with reference to the accompanying drawings.

A polar code is a kind of block code, an (N,k) polar code is a code having a length $N=2^n$, k information bits, and a code rate R of k/N. Further, an information bit is positioned on a high-reliability bit that can be seen by channel polarization, and a front bit is positioned on a low-reliability bit. In this case, 0 is generally positioned on the frozen bit.

Further, when an input codeword having a length N including information bits and frozen bits is $u_n$, an encoded codeword $x_n$ is as in Formula 1 and $G^{\otimes n}$ is n-th Kronecker power of $G=[_1{}^1{}_1{}^0]$.

$$x_n = u_n \cdot G^{\otimes n} \quad [\text{Formula 1}]$$

Meanwhile, an SC algorithm has been proposed to improve the performance of polar code algorithms and an SCL algorithm that manages candidate paths with L lists in the SC algorithm has been sequentially proposed. Referring to FIG. 3, the SCL algorithm improved the decoding possibility by using candidate paths, and showed similar performance to an LDPC algorithm by using a CRC (cyclic redundancy check) code as an outer code. Meanwhile, the present disclosure is based on the SCL algorithm and is intended to apply multi-bit determination algorithm to improve delay time and apply a method that uses a shared node to reduce the area of a decoding apparatus.

FIG. 1 is a flowchart illustrating a method of decoding polar codes based on a shared node according to an embodiment of the present disclosure.

Meanwhile, the method of decoding polar codes based on a shared node according to an embodiment of the present disclosure may be performed by an apparatus for decoding a polar code that includes an extractor, a sorter, a calculator, and a controller.

In step S110, the extractor extracts an input node from target data that are data to be decoded.

In this case, the target data is polar-encoded data, and the input node is a unit including a predetermined number of bits, and the input nodes are sequentially extracted from the target data.

In step S120, the sorter sorts the input node as one of a first node of which the pattern of the frozen bit satisfies a predetermined first reference, a second node of which the pattern of the information bit satisfies a predetermined second reference, and a third node that is not the first node and the second node.

For example, when there is one or less information bit in all bits constituting an input node and the one information bit is positioned at a least significant bit (LSB), the sorter can sort the input node as a first node. Further, when there is one or less frozen bit in all bits constituting an input node, the sorter can sort the input node as a second node. Further, when the input node is not the first node and the second node, the sorter can sort the input node as a third node.

In another embodiment, the sorter may sort an input node as a first node when the input node is a Rate-0 node composed of only a frozen bit or an REP node composed of a plurality of frozen bits and one information bit, and may sort an input node as a second node when the input node is a Rate-1 node composed of only an information bit or an SPC node composed of a plurality of information bits and one frozen bit.

Meanwhile, in a fast-simplified SC (Fast-SSC) decoding algorithm that is the related art, several bits were grouped and sorted as a Rate-0 node, an REP node, an SPC node, and a Rate-1 node. The present disclosure uses a node sorting system of a Fast-SSC decoding algorithm, but a Rate-0 node and an REP node may be grouped and sorted as a first node, a Rate-1 node and an SPC node may be grouped and sorted as a second node, and the other nodes may be sorted as a third node.

That is, in the present disclosure, nodes (e.g., a Rate-0 node and an REP node, and a Rate-1 node and an SPC node) where iterated calculation exists may be sorted as the same node and may be processed by applying the same method using the same hardware module, thereby being able to improve efficiency per unit area of a decoding apparatus.

In step S130, the calculator calculates at least one codeword candidate and at least one path metric that correspond to the input node in accordance with the sorting result.

For example, when the input node is a first node, the calculator can calculate at least one codeword candidate and at least one path metric by applying a method that is applied to the first node. In this case, the codeword candidate is a candidate value of a decoded result and the path metric is a value showing the reliability of the candidate value, in which the smaller the value, the higher the reliability may be.

In more detail, when the input node is a Rate-0 node or an REP node, the calculator can calculate at least one codeword candidate and at least one path metric using the same method (i.e., the method that is applied to the first node) for two nodes. This is because the information bit of the REP node may be determined as 0 or 1 and the Rate-0 node is included in a case having an information bit of 0.

$$PM_1 = \begin{cases} M_0 = \sum_{i=0}^{N_{R0\_REP}} \frac{1}{2}(1 - \text{sgn}(\alpha_i))|\alpha_i|, & \text{if}(n \cdot M_0) < M_1 \\ M_1 = \sum_{i=0}^{N_{R0\_REP}} \frac{1}{2}(1 + \text{sgn}(\alpha_i))|\alpha_i|, & \text{otherwise} \end{cases}$$ [Formula 2]

$$\text{where } n = \begin{cases} 0, & \text{if Rate-0 node} \\ 1, & \text{if REP node} \end{cases}$$

Meanwhile, the calculator can calculate $M_0$ that is a path metric of which the information bit is 0 and $M_1$ that is a path metric of which the information bit is 1, as in Formula 2, for 0 and 1 that are two possible paths at the REP node. However, since only $M_0$ is needed at the Rate-0 node, it should be $M_0$ that is the smallest path metric. In this case, $M_0$ is made to necessarily be selected using an n value according to the node kind in preparation for a situation when the $M_0$ value becomes larger than $M_1$.

Further, when the input node is a second node, the calculator can calculate at least one codeword candidate and at least one path metric by applying a method that is applied to the second node.

In more detail, when the input node is a Rate-1 node or an SPC node, the calculator can calculate at least one codeword candidate and at least one path metric using the same method (i.e., the method that is applied to the second node) for two nodes. This is because the decoding method of two nodes that are the Rate-1 node of which all bits are information bits and the SPC node including one frozen bit is the same except for the frozen bit of the SPC node.

In this case, since the SPC node includes one 0 that is a frozen bit, the encoding result on the corresponding bit pattern should necessarily satisfy an even parity. Accordingly, the calculator may determine that there are odd bits with an error when a hard decision result of LLR of a corresponding node is an odd parity in decoding. Further, the calculator may create a candidate path by finding a least reliable bit having a small LLR value and performing bit-flipping to determine several information bit at a time.

$$PM_1 = P \cdot \min_1$$ [Formula 3]

$$PM_2 = (1 - P) \cdot \min_1 + n \cdot \min_2$$

$$PM_3 = (1 - P) \cdot n \cdot \min_1 + (1 - n) \cdot \min_2 + n \cdot \min_3$$

where $n = \begin{cases} 0, & \text{if Rate-1 node} \\ 1, & \text{if SPC node} \end{cases}$ Meanwhile, the calculator can calculate a path metric at the second node using Formula 3. In the Formula 3, P is a value obtained through AND calculation of a parity check value and n. This is a method for ignoring the parity value at the Rate-1 node. Further, the n value is determined in accordance with the node kind.

Further, when the input node is a third node, the calculator can calculate at least one codeword candidate and at least one path metric by applying a method that is applied to the third node.

In more detail, when the input node is not the first node and the second node, the calculator can calculate at least one codeword candidate and at least one path metric using the same method (i.e., the method that is applied to the third node) for nodes corresponding to the other bit patterns. In this case, the calculator limits the number of bit patterns of a node by fixing the size of the third node to 8 bits. This is because when the bit patterns of a node increase, the number of the cases of creatable paths increases, so complexity increases.

In another embodiment, the calculator may calculate predetermined numbers of codeword candidates and path metrics in accordance with the ascending order of the path metrics.

Meanwhile, as the value of a path metric is small, the calculator may determine that the reliability of the codeword candidate corresponding to the path metric is high, so it is possible to calculate a predetermined number of codeword candidates and path metrics corresponding to the codeword candidates in accordance with the ascending order of path metrics. In this case, a value showing the reliability of a corresponding codeword candidate may be the path metric corresponding to the codeword candidate.

In another embodiment, when the input node is sorted as a third node, the calculator can calculate a primary codeword candidate and a path matric that correspond to the third node on the basis of low-order bits of the third node and determine a cordword candidate corresponding to the third node using high-order bits of the third node and the primary codeword candidate.

For example, referring to FIG. 4, the process of decoding the third node by the calculator may be divided into two steps. In this case, the size of the third node is 8-bit, the black circle is an information bit, and the white circle is a frozen bit.

First, the calculator can calculate a primary codeword candidate and a path metric by determining low-order 4 bits of 8 bits.

In general, in the third node, many information bits are distributed in low-order bits and many frozen bits are distributed in high-order bits. Accordingly, the calculator can expand a possible path into four by performing parity check in accordance with the fifth bit of the low-order 4 bits. In this case, it is possible to calculate a path metric using the following Formula 4.

$PM_1 = p \cdot \min_1$ $PM_2 = (1-p) \cdot \min_1 + \min_2$ $PM_3 = (1-p) \cdot \min_1 + \min_3$ $PM_4 = (1-p) \cdot \min_1 + (1-p) \cdot \min_2 + p \cdot \min_2$ [Formula 4]

Next, the calculator can determine a codeword candidate by determining high-order 4 bits using the candidate paths determined at the low-order 4 bits.

That is, the calculator can check the reliability of bits using the fact that there are many frozen bits in high-order bits. The calculator, in this process, can select a value with high possibility from 0 or 1. Further, it is possible to determine a codeword candidate by combining the selected value and the primary codeword candidate.

Finally, in step S140, the controller iterates step S110, step S120, and step S130 on the basis of the calculated path metric, thereby finishing decoding the target data.

That is, the controller can finish decoding the target data by iterating step S110, step S120, and step S130 using the path metric calculated in step S130 and a codeword candidate corresponding to the path metric.

In this case, the reason that the controller is based on the path metric calculated in step S130 may be for reducing delay time due to decoding by limiting the number of this decoding result that influences next iteration using the calculated path metric.

In another embodiment, the controller may iterate the calculating of at least one path metric to calculate differently determined numbers of codeword candidates and path metrics in accordance with the ascending order of the calculated path metrics.

Meanwhile, the controller can determine a predetermined number of candidate lists L at every iteration of step S110, step S120, and step S130. In this case, when L is 2, two candidates exist, and when L is 4, four candidates exist.

As a result, when the controller creates a candidate list, it is required to expand paths into at least L paths for one path. That is, when L is 2, four paths are created, and when L is 4, sixteen paths are created, and L paths should be finally left by arranging path metrics. However, it takes a long time to arrange sixteen path metrics. In order to reduce the path metrics, a new short tailed sorter that can be applied to L=4 or L>4 is proposed.

For example, when L is 4, there are four outputs of a sorter and the controller outputs four path metrics in order of smaller ones. In the next iteration, four paths each expand into four paths, so a total of sixteen paths are created. In this case, the controller expands paths into not four, but three paths when a path metric expands two small paths, and expands paths into not four, but one path when a path metric expands two large paths. Accordingly, not sixteen, but eight paths (i.e., codeword candidates) and path metrics can be created, as in FIG. 5. That is, the controller can reduce the input of a sorter by selecting paths with large possibility.

On the other hand, referring to FIG. 6, it is possible to see that deterioration of BER performance according to whether a short tailed sorter is applied is not large.

As described above, since the method of decoding a polar code based on a shared node according to an embodiment of the present disclosure uses a node grouping two kinds of nodes, and nodes for other bits to determine multiple bits, a short clock cycle is consumed, high throughput is shown, and an area can be reduced using a shared node, so there is an effect of excellent throughput to an area.

FIG. 2 is a block diagram illustrating an apparatus for decoding polar codes based on a shared node according to an embodiment of the present disclosure.

Referring to FIG. 2, an apparatus 200 for decoding polar codes based on a shared node according to an embodiment of the present disclosure includes an extractor 210, a sorter 220, a calculator 230, and a controller 240.

The apparatus 200 for decoding polar codes based on a shared node according to an embodiment of the present disclosure may be mounted on a device for wireless communication such as 5G, Wi-Fi, Bluetooth, and Zigbee, a storage device such as an SSD and a flash memory, and an image processing device (DVD, HDTV), a biosystem, or the like.

The extractor 210 extracts an input node from target data that are data to be decoded.

The sorter 220 sorts the input node as one of a first node of which the pattern of the frozen bit satisfies a predetermined first reference, a second node of which the pattern of the information bit satisfies a predetermined second reference, and a third node that is not the first node and the second node.

In another embodiment, the sorter 220 may sort the input node as a first node when the input node is a Rate-0 node composed of only a frozen bit or an REP node composed of a plurality of frozen bits and one information bit, and may sort the input node as a second node when the input node is a Rate-1 node composed of only an information bit or an SPC node composed of a plurality of information bits and one frozen bit.

The calculator 230 calculates at least one codeword candidate and at least one path metric that correspond to the input node in accordance with the sorting result.

In another embodiment, the calculator 230 may calculate a predetermined number of codeword candidates and path metrics in accordance with the ascending order of path metrics.

In another embodiment, when the input node is sorted as a third node, the calculator 230 can calculate a primary codeword candidate and a path metric that correspond to the third node on the basis of low-order bits of the third node, and determine a codeword candidate corresponding to the third node using high-order bits of the third node and the primary codeword candidate.

The controller 240 finishes decoding the target data by repeatedly controlling the extractor 210, the sorter 220, and the calculator 230 on the basis of the calculated path metrics.

In another embodiment, the controller 240 may control the calculator 230 to calculate differently determined numbers of codeword candidates and path metrics in accordance with the ascending order of the calculated path metric.

The embodiments of the present disclosure described above may be written as programs that can be executed in a computer and may be implemented in a common digital computer that executes the programs using a computer-readable recording medium.

The computer-readable recording medium includes a magnetic storage medium (e.g., a ROM, a floppy disk, and a hard disk) and an optical reading medium (e.g., a CD-ROM and a DVD).

Preferred embodiments of the present invention were described. It would be understood by those skilled in the art that the present disclosure may be modified without departing from the scope of the present disclosure. Therefore, the disclosed embodiments should be considered in terms of explaining, not limiting. The scope of the present disclosure is not shown in the above description, but claims, and all differences within an equivalent range should be construed as being included in the present disclosure.

What is claimed is:

1. A method of decoding a polar code based on a shared node, the method comprising:
   extracting an input node from target data that are data to be decoded, by an extractor;
   sorting the input node as one of a first node of which a pattern of a frozen bit satisfies a predetermined first reference, a second node of which a pattern of an information bit satisfies a predetermined second reference, and a third node that is not the first node and the second node, by a sorter;
   calculating at least one codeword candidate and at least one path metric that correspond to the input node in accordance with the sorting result, by a calculator; and
   finishing decoding the target data by iterating the extracting of an input node, the sorting of the input node as one, and the calculating of at least one path metric on the basis of the calculated path metric, by a controller.

2. The method of claim 1, wherein the calculating of at least one path metric calculates predetermined numbers of the codeword candidates and the path metrics in accordance with the ascending order of the path metrics.

3. The method of claim 1, wherein the finishing of decoding the target data iterates the calculating of at least one path metric to calculate differently determined numbers of the codeword candidates and the path metrics in accordance with the ascending order of the calculated path metrics.

4. The method of claim 1, wherein the sorting of the input node as one node sorts the input node as the first node when the input node is a Rate-0 node composed of only the frozen bit or an REP node composed of the plurality of frozen bits and the one information bit, and
   sorts the input node as the second node when the input node is a Rate-1 node composed of only the information bit or an SPC node composed of the plurality of information bits and the one frozen bit.

5. The method of claim 1, wherein the calculating of at least one path metric includes: when the input node is sorted as the third node,
   calculating a primary codeword candidate and the path metric that correspond to the third node on the basis of low-order bits of the third node; and
   determining the codeword candidate corresponding to the third node using high-order bits of the third node and the primary codeword candidate.

6. An apparatus for decoding a polar code based on a shared node, the apparatus comprising:
   an extractor that extracts an input node from target data that are data to be decoded;
   a sorter that sorts the input node as one of a first node of which a pattern of a frozen bit satisfies a predetermined first reference, a second node of which the pattern of an information bit satisfies a predetermined second reference, and a third node that is not the first node and the second node;
   a calculator that calculates at least one codeword candidate and at least one path metric that correspond to the input node in accordance with the sorting result; and
   a controller that finishes decoding the target data by repeatedly controlling the extractor, the sorter, and the calculator on the basis of the calculated path metrics.

7. The apparatus of claim 6, wherein the calculator calculates predetermined numbers of the codeword candidates and the path metrics in accordance with the ascending order of the path metrics.

8. The apparatus of claim 6, wherein the controller controls the calculator to calculate differently determined numbers of the codeword candidates and the path metrics in accordance with the ascending order of the calculated path metrics.

9. The apparatus of claim 6, wherein the sorter sorts the input node as the first node when the input node is a Rate-0 node composed of only a frozen bit or an REP node composed of the plurality of frozen bits and the one information bit, and sorts the input node as the second node when the input node is a Rate-1 node composed of only the information bit or an SPC node composed of the plurality of information bits and the one frozen bit.

10. The apparatus of claim 6, wherein when the input node is sorted as the third node, the calculator calculates a primary codeword candidate and the path metric that correspond to the third node on the basis of low-order bits of the third node, and determines the codeword candidate corresponding to the third node using high-order bits of the third node and the primary codeword candidate.

* * * * *